(12) United States Patent
Kim et al.

(10) Patent No.: US 12,247,290 B2
(45) Date of Patent: Mar. 11, 2025

(54) FLOW CONTROL METHOD USING PLASMA SYSTEM

(71) Applicant: Samsung Electronics Co., Ltd., Suwon-si (KR)

(72) Inventors: Suncheul Kim, Suwon-si (KR); Donghyun Lee, Suwon-si (KR); Uihyoung Lee, Suwon-si (KR); Donghoon Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 148 days.

(21) Appl. No.: 18/197,919

(22) Filed: May 16, 2023

(65) Prior Publication Data

US 2024/0026539 A1  Jan. 25, 2024

(30) Foreign Application Priority Data

Jul. 20, 2022 (KR) .......................... 10-2022-0089688

(51) Int. Cl.
*C23C 16/52* (2006.01)
*C23C 16/448* (2006.01)
*C23C 16/505* (2006.01)

(52) U.S. Cl.
CPC .......... *C23C 16/52* (2013.01); *C23C 16/4486* (2013.01); *C23C 16/505* (2013.01)

(58) Field of Classification Search
CPC ... C23C 16/52; C23C 16/448; C23C 16/4486; C23C 16/505; C23C 16/455; C23C 16/45502
See application file for complete search history.

(56) References Cited

U.S. PATENT DOCUMENTS

| | | | |
|---|---|---|---|
| 7,671,329 B2 | 3/2010 | Sakata et al. | |
| 8,056,399 B2 | 11/2011 | Thompson et al. | |
| 8,728,956 B2 | 5/2014 | LaVoie et al. | |
| 2005/0098906 A1* | 5/2005 | Satoh | C23C 16/455 438/758 |
| 2006/0169201 A1 | 8/2006 | Hwang et al. | |
| 2021/0343520 A1 | 11/2021 | Qian et al. | |
| 2022/0037135 A1 | 2/2022 | Kapoor et al. | |
| 2022/0238325 A1 | 7/2022 | Agnew et al. | |
| 2023/0235460 A1* | 7/2023 | Kobayashi | H01J 37/32183 118/726 |

FOREIGN PATENT DOCUMENTS

KR  10-0636038 B1  10/2006
KR  10-2022-0006663 A  1/2022

* cited by examiner

*Primary Examiner* — Michael P Wieczorek
(74) *Attorney, Agent, or Firm* — Sughrue Mion, PLLC

(57) ABSTRACT

Provided is a flow rate control method, including: supplying fluid from a valve to a first sensor; measuring, by the first sensor, a first temperature of the fluid, and heating the fluid; measuring, by a second sensor, a second temperature of the heated fluid, and determining, by a controller, a first flow rate of the fluid based on comparison between the first temperature and the second temperature; supplying the fluid to a chamber and supplying an ignition voltage to the chamber through a radio frequency (RF) power source; measuring, by a third sensor, the ignition voltage; comparing, by the controller, the ignition voltage and a reference voltage to determine a second flow rate of the fluid; and controlling a supply of the fluid from the valve based on at least one of the first flow rate and or the second flow rate.

20 Claims, 7 Drawing Sheets

FLOW CONTROL METHOD USING PLASMA SYSTEM

CROSS-REFERENCE TO RELATED APPLICATION

This application is based on and claims priority under 35 U.S.C. § 119 to Korean Patent Application No. 10-2022-0089688, filed on Jul. 20, 2022, in the Korean Intellectual Property Office, the disclosure of which is incorporated by reference herein in its entirety.

BACKGROUND

The disclosure relates to a flow rate control method, and more particularly, to a flow rate control method using a plasma process system.

In general, a semiconductor device is manufactured by sequentially performing a series of unit processes for film formation, pattern formation, metal wiring formation, and the like. Chemical vapor deposition (CVD), physical vapor deposition (PVD), atomic layer deposition (ALD), and the like may be used to form a film. When forming a film on a semiconductor substrate using the deposition method, various reactants may be used. The reactants are generally supplied in a gaseous state to form a film on a substrate. However, in the related art, when an aerosol is formed from a gaseous reactant in the step of supplying the reactants, the flow rate of the reactants cannot be accurately determined.

SUMMARY

One or more example embodiments of the disclosure provide a flow rate control method for accurately determining the flow rate of an aerosol-state fluid by using a plasma ignition voltage.

According to an aspect of the disclosure, there is provided a flow rate control method including: supplying a fluid from a valve to a first sensor; measuring, by the first sensor, a first temperature of the fluid, and heating the fluid; measuring, by a second sensor, a second temperature of the heated fluid, and determining, by a controller, a first flow rate of the fluid based on comparison between the first temperature and the second temperature; supplying the fluid to a chamber and supplying an ignition voltage to the chamber through a radio frequency (RF) power source; measuring, by a third sensor, the ignition voltage; comparing, by the controller, the ignition voltage and a reference voltage to determine a second flow rate of the fluid; and controlling a supply of the fluid from the valve based on at least one of the first flow rate and or the second flow rate.

According to another aspect of the disclosure, there is provided a flow rate control method including: supplying a fluid from a valve to a first sensor; measuring, by the first sensor, a first temperature of the fluid, and heating the fluid; measuring, by a second sensor, a second temperature of the heated fluid, and determining, by a controller, a first flow rate of the fluid by comparing the first temperature and the second temperature; supplying the fluid to a chamber and supplying an ignition voltage to the chamber through a radio frequency (RF) power source; adjusting, by an RF matcher, an impedance in response to the ignition voltage; measuring, by a third sensor, the adjusted impedance of the RF matcher; comparing, by the controller, the adjusted impedance and a reference impedance to determine a second flow rate of the fluid; and controlling a supply of the fluid from the valve based on at least one of the first flow rate and or the second flow rate.

According to another aspect of the disclosure, there is provided a flow rate control method including: supplying a fluid from a valve to a first sensor; measuring, by the first sensor, a first temperature of the fluid, and heating the fluid; measuring, by a second sensor, a second temperature of the heated fluid, and determining, by a controller, a first flow rate of the fluid by comparing the first temperature and the second temperature; supplying the fluid to a chamber and supplying an ignition voltage to the chamber through an RF power source; measuring, by a third sensor, the ignition voltage; comparing, by the controller, the ignition voltage and a reference voltage to determine a second flow rate of the fluid in a liquid state, a gaseous state, an aerosol state, or a combination thereof; and transmitting, by the controller, a feedback signal to the valve based on a result of the comparing the ignition voltage and the reference voltage, wherein the ignition voltage is a minimum voltage that is to be supplied to the chamber to ignite a plasma in the fluid, wherein the supplying the fluid includes supplying the fluid at a flow rate of 3 Standard Cubic Centimeter per Minute (sccm) to 20 sccm, and the fluid includes titanium tetrachloride ($TiCl_4$), and wherein the reference voltage is 1 V to 100 V.

BRIEF DESCRIPTION OF THE DRAWINGS

Example embodiments will be more clearly understood from the following detailed description taken in conjunction with the accompanying drawings in which.

DETAILED DESCRIPTION

Hereinafter, example embodiments will be described in detail with reference to the accompanying drawings. However, the disclosure should not be construed as being limited to the embodiments described below and may be embodied in various other forms. The following examples are provided to convey the scope of aspects of the disclosure to those skilled in the art. Background information known to those skilled in the art are not provided in detail. Further, those skilled in the art would understand that modifications can be made which stall fall within the scope of the disclosure.

Figure 1:
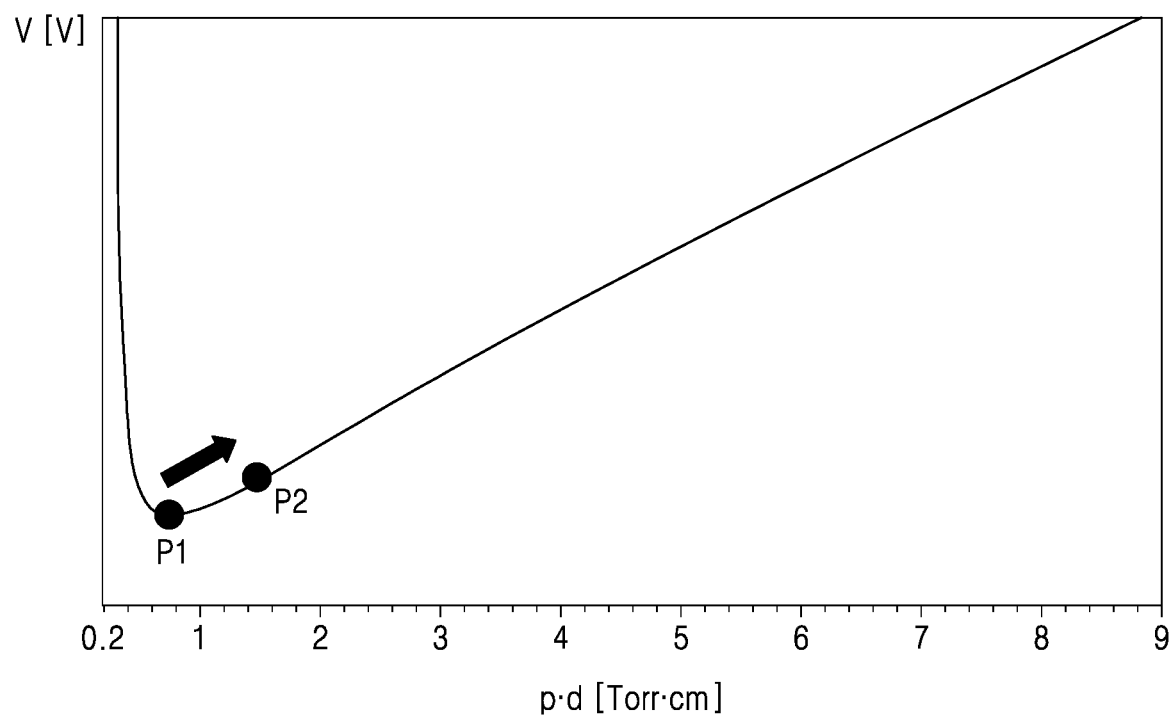
FIG. 1 is a graph showing a correlation between an ignition voltage and a pressure applied to a fluid.

FIG. 1 is a graph showing the correlation between an ignition voltage and a pressure applied to a fluid.

Figure 4:
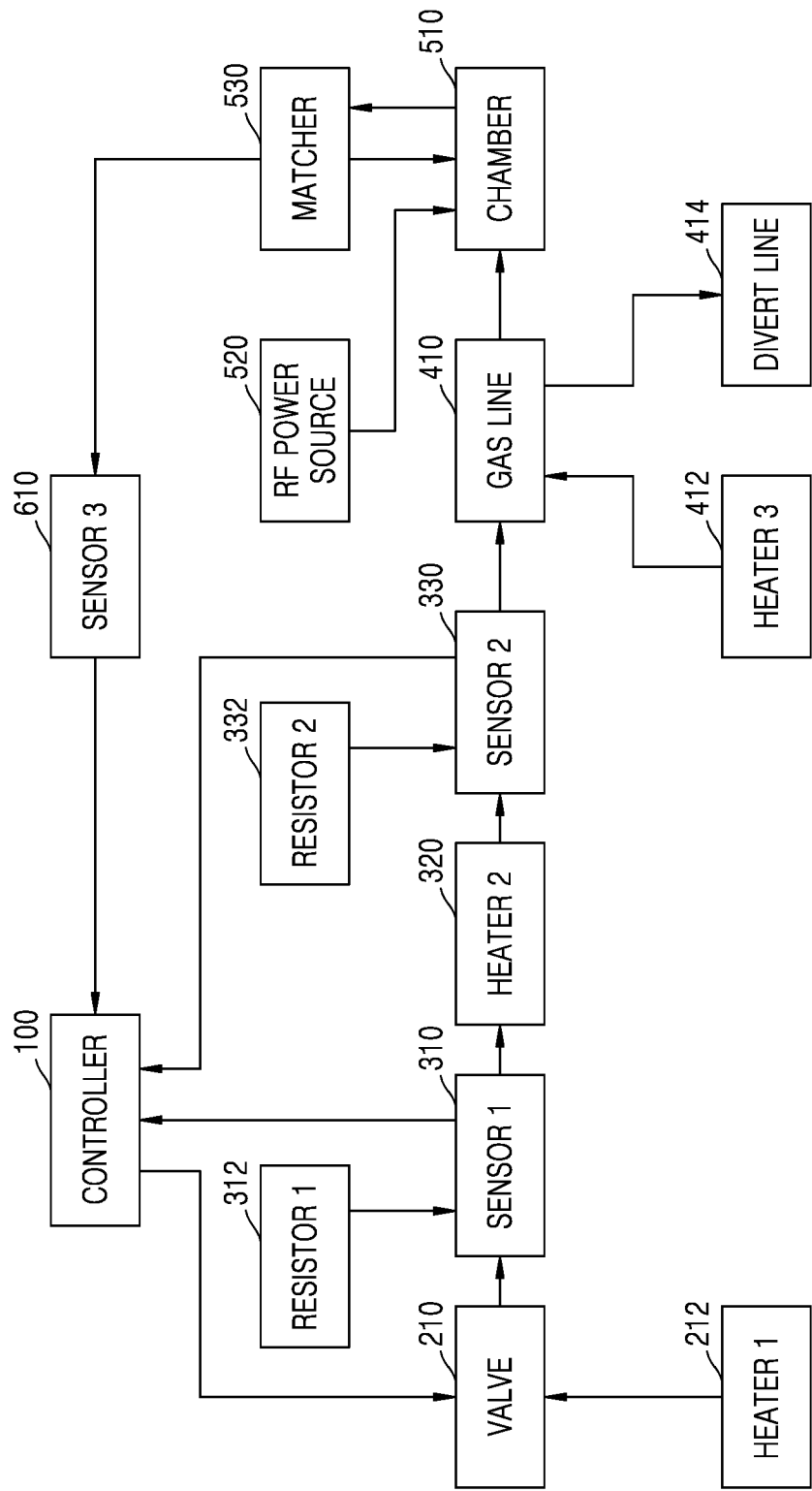
FIG. 4 is a diagram for explaining a mechanism of a flow rate control method according to example embodiments.

The X-axis of this graph represents the product of a pressure P of the fluid supplied to a chamber 510 shown in FIG. 4 and a distance d between the electrodes. The Y-axis of this graph represents an ignition voltage V required for the fluid supplied to the chamber 510 shown in FIG. 4 to cause a discharge. That is, the ignition voltage V may represent a minimum voltage that needs to be supplied to the chamber to ignite plasma in the fluid.

Referring to FIG. 1, with the distance d between the electrodes being constant, as the pressure P of the fluid is reduced, the fluid is not ionized and it may be difficult for the fluid to discharge. Therefore, the required ignition voltage V may be determined according to the pressure P of the fluid. In other words, the pressure P of the fluid and the ignition voltage V may have a proportional relationship. Since the pressure P of the fluid is proportional to the flow rate of the fluid, eventually the flow rate of the fluid and the ignition voltage V may be in a proportional relationship.

Figure 2:
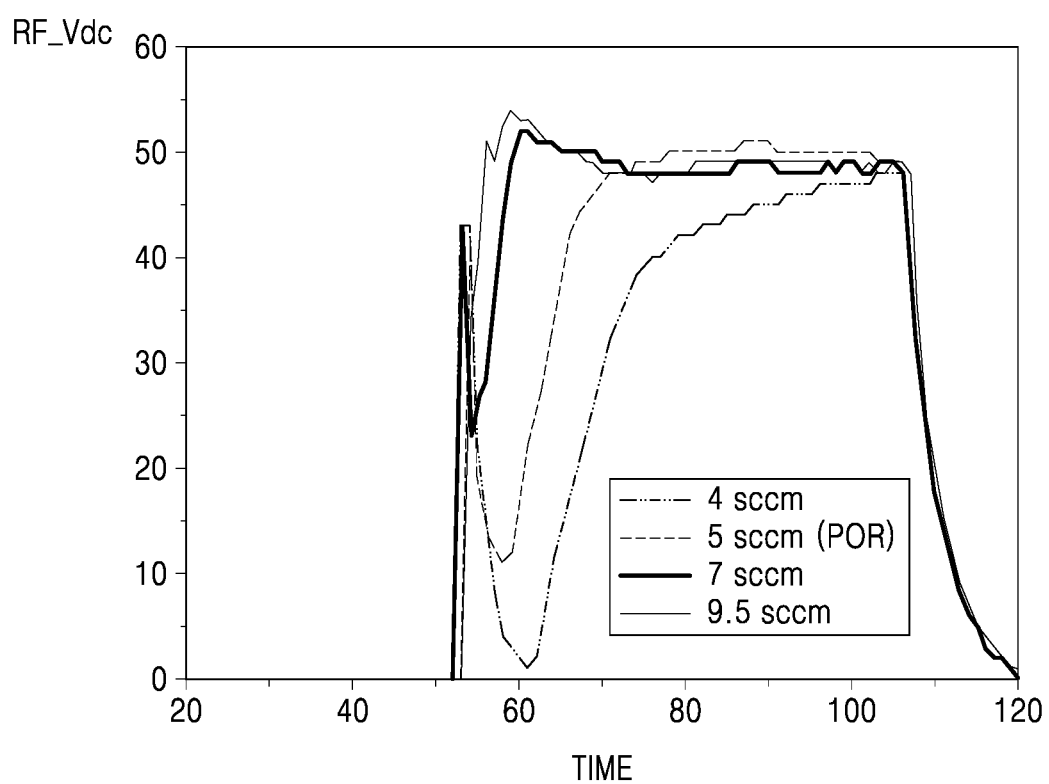
FIG. 2 is a graph illustrating a correlation between an ignition voltage and a flow rate of a fluid; embodiments.

FIG. 2 is a graph illustrating a correlation between an ignition voltage and a flow rate of a fluid.

Referring to FIG. 2, the ignition voltage increases as the flow rate of the fluid increases. In this graph, the X-axis represents the time at which a voltage starts to be supplied to the chamber 510, and the Y-axis represents the ignition voltage at which the plasma starts ignition. Standard Cubic Centimeter per Minute (Sccm) is a unit indicating how many cc of gas flows per minute in a standard state, and is a unit indicating the flow rate of a fluid. In this case, the standard state may represent 0 degrees C. at a pressure of 1 atm.

According to this graph, it may be seen that the ignition voltage increases as the flow rate of the fluid increases, starting from 50 seconds after the voltage starts to be supplied to the chamber 510. Therefore, as the flow rate of the fluid increases, the ignition voltage increases. Finally, measuring the ignition voltage may determine the flow rate of the fluid in the chamber.

FIG. 4 is a diagram for explaining a mechanism of a flow rate control method according to example embodiments. Referring to FIG. 4, a matcher 530 adjusts an impedance so that the RF power provided from an RF power source 520 may be transferred to the plasma chamber 510 to the maximum. Since an impedance and a voltage have a proportional relationship, the impedance controlled by the matcher 530 and the ignition voltage supplied by the RF power source 520 to the chamber 510 may have a proportional relationship. After all, in the same principle of measuring the flow rate of the fluid in the chamber by measuring the ignition voltage, the flow rate of the fluid in the chamber may be measured by measuring the impedance controlled by the matcher 530.

Figure 3:
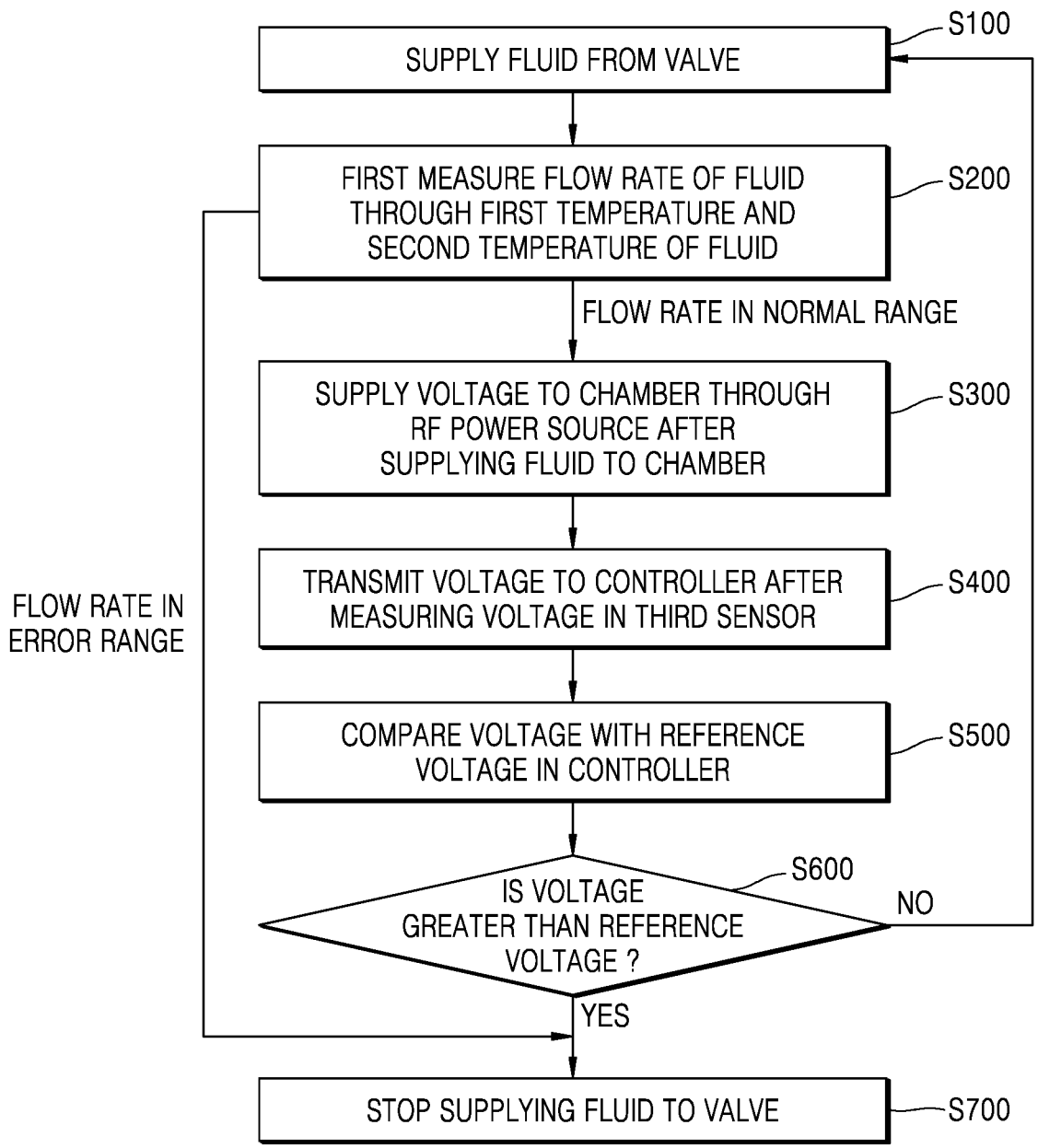
FIG. 3 is a flowchart of a flow rate control method according to example

FIG. 3 is a flowchart of a flow rate control method according to example embodiments.

Referring to FIG. 3, the flow rate control method using a plasma system includes supplying a fluid from a valve (S100), measuring a flow rate of the fluid based on a first temperature and a second temperature of the fluid (S200), supplying a voltage to the chamber through an RF power source after supplying the fluid to the chamber (S300), transmitting the voltage to the controller after measuring the voltage in a third sensor (S400), and comparing the voltage with a reference voltage in the controller (S500). In the operation of S200, if the flow rate of the fluid determined based on the first temperature and the second temperature in S200 is in a normal range (e.g., when the flow rate of the fluid is lower than a reference flow rate), the flow rate control method proceeds to S300, and if the flow rate of the fluid determined in S200 is in an error range (e.g., when the flow rate of the fluid is higher than the reference flow rate), the flow rate control method proceeds to S700, in which the controller transmits a signal to stop supplying the fluid to the valve.

According to an example embodiment, the flow rate control method using plasma may further include, after comparing the voltage to the reference voltage in the controller in S500, determining whether the voltage is higher than a reference voltage and transmitting a feedback signal to the valve (S600). The voltages referred to in S300, S400, S500, and S600 represent the ignition voltage, which is the minimum voltage that is required to be supplied to the chamber to ignite the fluid into plasma. When the ignition voltage is lower than the reference voltage, the controller may transmit a supply signal of the fluid to the valve so that the fluid continues to be supplied from the valve in S100. When the ignition voltage is higher than the reference voltage, the controller may transmit a signal to stop supplying the fluid to the valve (S700). Each of the above operations will be described in detail later with reference to FIG. 6.

Referring back to FIG. 4, the controller 100 may transmit a fluid supply signal to the valve 210. Thereafter, the valve 210 may supply the fluid to a first sensor 310. In this case, the flow rate of the fluid supplied by the valve 210 to the first sensor 310 may be 3 sccm to 20 sccm. In addition, the fluid may include titanium tetrachloride ($TiCl_4$), but is not necessarily limited to the above material.

The valve 210 may be configured to control the flow rate of the fluid. The type of the valve 210 is various, and the type of the valve 210 may be easily selected by a person skilled in the art. For example, if the exhaust line connectable to the valve 210 is a curved exhaust line, a bellows-type valve may be used. The bellows-type valve may be installed adjacent to the bent part of the exhaust line, and a solenoid or pneumatic device may be used as a power source for contracting or extending the bellows-type valve.

According to an example embodiment, a piezo valve may be used to control the flow rate of the fluid. When a voltage is applied to a stacked piezoelectric element of the piezoelectric valve, the displacement in the extension direction of the stacked piezoelectric element is transmitted to the valve body through the displacement expansion mechanism, and the valve body may be moved quickly to open the valve. In addition, when the voltage application to the stacked piezoelectric element is released, the return force accompanying the return of the stacked piezoelectric element to its original state is transmitted to the valve body through the displacement expansion mechanism, and closes the valve by quickly abutting its valve body against the valve seat. Although a bellows type valve and a piezo valve have been described in detail above as the type of the valve 210, the valve 210 is not necessarily limited to the above type.

According to an example embodiment, a first heater 212 may be connected to the valve 210, and the first heater 212 may vaporize a fluid supplied through the valve 210. Therefore, the valve 210 may supply the fluid in a gas state to the first sensor 310.

The first sensor 310 supplied with the fluid from the valve 210 may measure a first temperature of the fluid. The first sensor 310 may be connected to a first resistor 312 and may use the resistance of the first resistor 312 in the process of measuring the first temperature of the fluid. Thereafter, the first sensor 310 may transmit a value of the first temperature to the controller 100. After transmitting the value of the first temperature to the controller 100, the first sensor 310 may supply the fluid to a second heater 320. The second heater 320 may supply heat to the first sensor 310. According to an example embodiment, the fluid in a gaseous state supplied with heat from the second heater 320 may be supplied to a second sensor 330. Thereafter, the second sensor 330 may measure a second temperature of the fluid. The second sensor 330 may be connected to a second resistor 332, and the resistance of the second resistor 332 may be used in the process of measuring the second temperature of the fluid. Thereafter, the second sensor 330 may transmit a value of the second temperature to the controller 100. The controller 100 may compare the first temperature with the second temperature to first determine the flow rate of the fluid. In this case, the fluid of which the flow rate is to be determined may be a fluid in a gas state. A detailed description of a process in which the first sensor 310 and the second sensor 330 respectively measure the first temperature and the second temperature will be described later with reference to FIGS. 6 and 7.

According to an example embodiment, the fluid may be supplied from the second sensor 330 to a gas line 410. A third heater 412 and a divert line 414 may be connected to the gas line 410. The third heater 412 may be configured to supply heat for smooth movement of the fluid. The divert line 414 may be an example of an additional device configured to control an accurate flow rate of a fluid. Specifically, a fluid may be supplied from the gas line 410 to the chamber 510. In this case, to smoothly supply the fluid from the gas line 410 to the chamber 510, a carrier gas for moving the fluid into the chamber may be supplied. The divert line 414 may be configured to minimize a change in the flow rate of the fluid after the fluid is supplied to the chamber 510 by the carrier gas. For example, the divert line 414 may have a structure for diverting only the fluid, a structure for enabling pressure control of the divert line 414, or a structure for dividing and flowing a carrier gas. According to an example embodiment, the fluid may be supplied to the chamber 510 through the gas line 410. The chamber 510 may be connected to the RF power source 520 and the matcher 530. The fluid may be in a plasma state by receiving a voltage from the RF power source 520 in the chamber 510, and a detailed process for this will be described later with reference to FIG. 7.

The RF power source 520 may supply an ignition voltage to the chamber 510, and a third sensor 610 may be configured to measure the ignition voltage. The third sensor 610 may be a voltage-current probe (V-I probe). The V-I probe may be inserted into the power line between the electrode or coil used for plasma generation and the matcher 530, and may refer to a diagnostic device that views the entire plasma reactor as a kind of equivalent circuit and measures changes in electrical characteristics in the plasma reactor. The plasma reactor referred to herein may be a term referring to an entire system including an electrode, a coil, or a plasma chamber. The V-I probe may measure voltage, current, phase difference, reflected power, etc. of harmonics, and display a measurement result of the harmonics through a fast Fourier transform. Physical quantities, such as voltage, current, phase difference, and reflected power listed above, may react very sensitively to the state of the plasma reactor. That is, changes in the plasma density, electron temperature, composition of substances present in the plasma, or even small changes in the reactor surface state may affect the measured values. Also, the third sensor 610 may measure an impedance adjusted by the matcher 530, which will be described later.

The matcher 530 may maximize the RF power delivery of the RF power source 520 by adjusting impedance so that a complex conjugate condition is satisfied based on a maximum power delivery theory.

According to an example embodiment, the state of the fluid supplied to the chamber 510 through the gas line 410 may be a liquid state, a gaseous state, an aerosol state, or a combination thereof. The RF power source 520 supplies an ignition voltage to the chamber 510, and the fluid may be put into a plasma state. The third sensor 610 may measure the ignition voltage supplied by the RF power source 520. Thereafter, the third sensor 610 may transmit the measured value of the ignition voltage to the controller 100. The controller 100 may secondarily determine the flow rate of the fluid using the correlation between the ignition voltage and the flow rate of the fluid described with reference to FIGS. 2 and 3. In this case, the fluid to be determined secondarily may be in a liquid state, a gas state, an aerosol state, or a state of a combination thereof.

According to an example embodiment, the controller 100 may compare the ignition voltage with a reference voltage to secondarily determine the flow rate of the fluid. The reference voltage may be a voltage set by the controller 100 to compare with any arbitrary voltage. In this case, the reference voltage may be 1 V to 100 V. When the ignition voltage is higher than the reference voltage, the flow rate of the fluid may be in a high state, and when the ignition voltage is lower than the reference voltage, the flow rate of the fluid may be in a low state.

The controller 100 may transmit a feedback signal to the valve 210 based on secondary measurement of the flow rate of the fluid by comparing the ignition voltage to the reference voltage. Specifically, when the ignition voltage is lower than the reference voltage, the controller 100 may transmit a fluid supply signal to the valve 210. Accordingly, the valve 210 may continuously supply the fluid. When the ignition voltage is higher than the reference voltage, the controller 100 may transmit a signal to stop supplying the fluid to the valve 210. As a result, the flow rate of the fluid may be controlled using the feedback signal of the controller 100.

According to another embodiment, the RF power source 520 may supply an ignition voltage to the chamber 510 and the fluid may be in a plasma state. In this case, the matcher 530 adjusts impedance so that the RF power from the RF power source 520 may be transferred to the plasma chamber 510 to the maximum. That is, the impedance controlled by the matcher 530 and the ignition voltage supplied by the RF power source 520 may have a proportional relationship. The third sensor 610 may measure the impedance adjusted by the matcher 530. Thereafter, the third sensor 610 may transmit the measured impedance value to the controller 100. The controller 100 may secondarily determine the flow rate of the fluid using the correlation between the impedance and the flow rate of the fluid. In this case, the fluid to be measured secondarily may be in a liquid state, a gas state, an aerosol state, or a state of a combination thereof.

The controller 100 may compare the impedance to a reference impedance to secondarily determine the flow rate of the fluid. The reference impedance may be an impedance set by the controller 100 to compare with any arbitrary impedance. That is, when the impedance is higher than the reference impedance, the flow rate of the fluid may be in a high state, and when the impedance is lower than the reference impedance, the flow rate of the fluid may be in a low state.

The controller 100 may transmit a feedback signal to the valve 210 after secondary measurement of the flow rate of the fluid by comparing the impedance with the reference impedance. Specifically, when the impedance is lower than the reference impedance, the controller 100 may transmit a fluid supply signal to the valve 210. Accordingly, the valve 210 may continuously supply the fluid. When the impedance is higher than the reference impedance, the controller 100 may transmit a signal to stop the supply of the fluid to the valve 210. As a result, the flow rate of the fluid may be controlled using the feedback signal of the controller 100.

Figure 5:
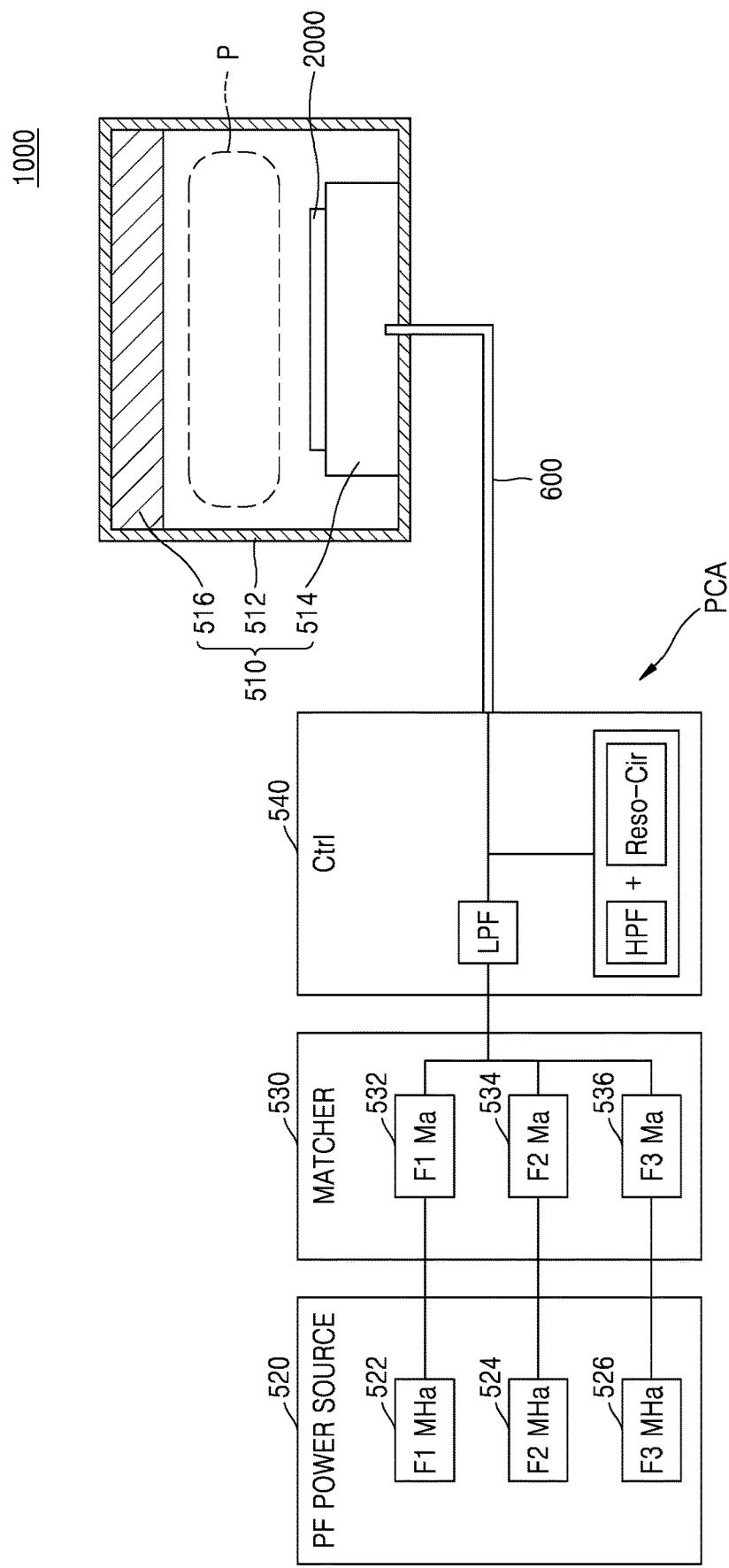
FIG. 5 is a configuration diagram of a plasma processing system according to example embodiments.

FIG. 5 is a configuration diagram of a plasma processing system according to embodiments.

Referring to FIG. 5, the plasma processing system 1000 of this embodiment may include a radio frequency (RF) power source 520, a matcher 530, a plasma control circuit 540, a transmission line 600, and a chamber 510.

The RF power source 520 may generate and supply RF power to the chamber 510. The RF power source 520 may generate and output RF power of various frequencies. For example, the RF power source 520 may include three sources, for example, a first source 522, a second source 524, and a third source 526. Here, the first source 522 may generate RF power having a first frequency F1 HMz in the range of several MHz to several tens of MHz. The second source 524 may generate RF power having a second frequency F2 MHz in the range of several hundred kHz to several MHz. The third source 526 may generate RF power having a third frequency F3 kHz in the range of several tens of kHz to several hundreds of kHz. In addition, each of the three sources, that is, the first source 522, the second source 524, and the third source 526, of the RF power source 520 may generate and output power of several hundred to tens of thousands of watts (W). In the plasma processing system 1000 of an example embodiment, the RF power source 520 includes three sources, that is, the first source 522, the second source 524, and the third source 526, but the number of sources included in the RF power source 520 is not limited to three. For example, the RF power source 520 may include two or more sources. In addition, the frequency range and power of the RF power generated by the source is not limited to the above-described numerical values. For example, according to an example embodiment, at least one source included in the RF power source 520 may generate RF power having a frequency of several tens of kHz or less or several hundred MHz or more. In addition, at least one source included in the RF power source 520 may generate RF power having a power of several hundred watts or less or several thousand watts or more.

For reference, in the plasma processing system 1000 of an example embodiment, the RF power source 520 may correspond to a power source for supplying power to the chamber 510. Also, the chamber 510 may be viewed as a kind of load receiving power from the RF power source 520. According to an example embodiment, in the plasma processing system 1000, the RF power source 520 may include at least six sources to generate RF power of various frequencies and supply the generated RF power to the plasma chamber 510. Through this, ion energy and plasma density of the plasma chamber 510 may be independently controlled. For example, in an example in which the RF power source 520 includes three sources, that is, the first source 522, the second source 524, and the third source 526, the high frequency RF power from the first source 522 may generate plasma, and the low frequency RF power from the third source 526 may energize ions. Meanwhile, the RF power of the intermediate frequency from the second source 524 may have a different function depending on an embodiment. For example, the RF power of the second source 524 may improve the functionality of the RF power from the first source 522 and/or the RF power from the third source 526. Meanwhile, to improve an etch rate and an etch profile by plasma in the chamber 510, RF power may be applied in as a pulse. The number of the second source 524 that provides the RF poser of the intermediate frequency is not limited.

The matcher 530 adjusts the impedance so that the RF power from the RF power source 520 may be transferred to the plasma chamber 510 to the maximum. For example, the matcher 530 may maximize RF power delivery by adjusting the impedance so that a complex conjugate condition is satisfied based on a maximum power delivery theory. For example, by driving the RF power source 520 in an environment of 50Ω so that reflected power is minimized, the matcher 530 may function to maximize the RF power from the RF power source 520 to the chamber 510. The matcher 530 may include three sub matchers, for example, first, second and third sub matchers 532, 534, and 536, corresponding to each frequency of the RF power. For example, the matcher 530 may include the first sub matcher 532 corresponding to a first frequency F1 MHz of the first source 522, the second sub matcher 534 corresponding to a second frequency F2 MHz of the second source 524, and the third sub matcher 536 corresponding to the third frequency F3 kHz of the third source 526. Each of the three sub matchers, that is, the first, second, and third sub matcher 532, 534, and 536, may adjust the impedance so that RF power of the corresponding frequency is transmitted to the plasma chamber 510 to the maximum.

The plasma control circuit 540 may selectively and/or independently control harmonics of a very high frequency (VHF) among frequencies of RF power to control and adjust the plasma distribution within the chamber 510. For example, the plasma control circuit 540 may selectively and/or independently control harmonics of a very high frequency in the first frequency F1 MHz of the first source 522 to control and adjust the plasma distribution in the chamber 510. Here, the plasma distribution may refer to a plasma density distribution. Meanwhile, only the plasma control circuit 540 may be treated as a plasma control apparatus (PCA) that controls plasma distribution in the chamber 510. Alternatively, according to an example embodiment, since the plasma control circuit 540 creates resonance together with the impedance of the matcher 530 and the transmission line 600, the PCA may include the matcher 530 and the transmission line 600 together with the plasma control circuit 540 as components. In other words, the plasma control device PCA may include the matcher 530, the plasma control circuit 540, and the transmission line 600.

The transmission line 600 may be disposed between the matcher 530 and the chamber 510 to transmit RF power to the chamber 510. Meanwhile, in an example embodiment, since the plasma control circuit 540 is disposed as an output terminal of the matcher 530, the transmission line 600 may be considered to be disposed between the plasma control circuit 540 and the chamber 510. Although not specifically illustrated, the transmission line 600 may also be disposed between the RF power source 520 and the matcher 530.

The transmission line 600 may be implemented as, for example, a coax cable, an RF strap, an RF rod, or the like. A coaxial cable may include a center conductor, an outer conductor, an insulator, and a sheath. The coaxial cable may have a structure in which a center conductor and an outer conductor are coaxially arranged. In general, coaxial cables have low attenuation up to high frequencies and are therefore suitable for broadband transmission, and may also have low leakage due to the presence of external conductors. Accordingly, the coaxial cable may be mainly used as a transmission cable used when the frequency is high. For example, the coaxial cable may effectively transmit RF power having a frequency in the range of several MHz to several tens of MHz without leakage. On the other hand, there are two types of coaxial cables with characteristic impedances of 50Ω and 75Ω.

The RF strap may include a strap conductor, a ground housing, and an insulator. The strap conductor may have a band-like shape extending in one direction. The ground housing may have the form of a circular tube surrounding the strap conductor at a preset distance. The ground housing may protect the strap conductor from RF radiation. On the other hand, an insulator may fill between the strap conductor and the ground housing. The RF rod may be structurally different from an RF strap in that the RF rod includes a rod conductor instead of a strap conductor. Specifically, the rod conductor of the RF rod may have a cylindrical shape extending in one direction. Such an RF strap or RF rod may deliver RF power having a frequency in the range of, for example, several MHz to several tens of MHz.

The impedance characteristic of the transmission line 600 may be changed by changing the physical characteristics of the implemented coaxial cable, RF strap, RF rod, and the like. For example, when the transmission line 600 is implemented as a coaxial cable, the impedance characteristic of the transmission line 600 may be changed by changing the length of the coaxial cable. In addition, when the transmission line 600 is implemented as an RF strap or RF rod, the impedance characteristics of the transmission line 600 may be changed by changing the length of the strap conductor or the rod conductor, changing the spatial size of the ground housing, or changing the dielectric constant and/or permeability of the insulator.

The chamber 510 may include a chamber body 512, an electrostatic chuck 514, and a shower head 516. The chamber 510 is a chamber for a plasma process, and plasma P may be generated therein. The chamber 510 may be a capacitively coupled plasma (CCP) chamber, an inductively coupled plasma (ICP) chamber, or a mixed CCP and ICP chamber. Of course, the chamber 510 is not limited to the aforementioned chambers. For reference, depending on the type of plasma chamber and the type of RF power applied to the plasma chamber, the plasma process system may be classified into a CCP method, an ICP method, and a CCP and ICP combined method. The plasma processing system 1000 of an example embodiment may be a CCP method or an ICP method. In addition, the plasma processing system 1000 of an example embodiment may be implemented using a CCP and ICP combined method.

The chamber body 512 may limit a reaction space in which plasma is formed to seal the reaction space from the outside. The chamber body 512 is generally formed of a metal material, and may maintain a ground state to block noise from the outside during a plasma process. A gas inlet, a gas outlet, a viewport, and the like may be formed in the chamber body 512. A process gas required for the plasma process may be supplied through the gas inlet. Here, the process gas may refer to all gases required in the plasma process, such as a source gas, a reaction gas, and a purge gas. After the plasma process through the gas outlet, gases in the plasma chamber 510 may be exhausted to the outside. Also, the pressure inside the plasma chamber 510 may be adjusted through the gas outlet. Meanwhile, one or more viewports may be formed in the chamber body 512, and the inside of the plasma chamber 510 may be monitored through the viewports.

The electrostatic chuck 514 may be disposed at a lower portion inside the plasma chamber 510. A wafer 2000 to be subjected to a plasma process may be disposed and fixed on the upper surface of the electrostatic chuck 514. The electrostatic chuck 514 may hold the wafer 2000 by electrostatic force. Also, the electrostatic chuck 514 may include a bottom electrode for a plasma process. The electrostatic chuck 514 may be connected to the RF power source 520 through the transmission line 600. Accordingly, RF power from the RF power source 520 may be applied into the plasma chamber 510 through the electrostatic chuck 514. The shower head 516 may be disposed at an upper portion inside the plasma chamber 510. The shower head 516 may inject process gases supplied through a gas inlet through a plurality of injection holes into the plasma chamber 510. Meanwhile, the shower head 516 may include a top electrode. The shower head 516 may be connected to ground in a plasma process, for example.

The plasma processing system 1000 may include at least one RF sensor. The RF sensor may be the third sensor 610 illustrated in FIG. 4. The RF sensor may be disposed at the output terminal of the RF power source 100 or the input terminal or output terminal of the matcher 200 to measure RF power delivered to the chamber 510 and/or the impedance of the chamber 510. By monitoring the state of the chamber 510 through the RF sensor, it is possible to effectively manage and control the transfer of RF power to the plasma chamber 510, and accordingly, the plasma process may be precisely performed.

The plasma processing system 1000 of an example embodiment includes the plasma control circuit 540 to create resonance with respect to harmonics of very short waves among frequencies of RF power delivered to the chamber 510 so that plasma distribution in the chamber 510 may be uniformly controlled and adjusted. Accordingly, the deposition process on the wafer 2000, which is the target of the plasma process, may be uniformly performed.

Figure 6:
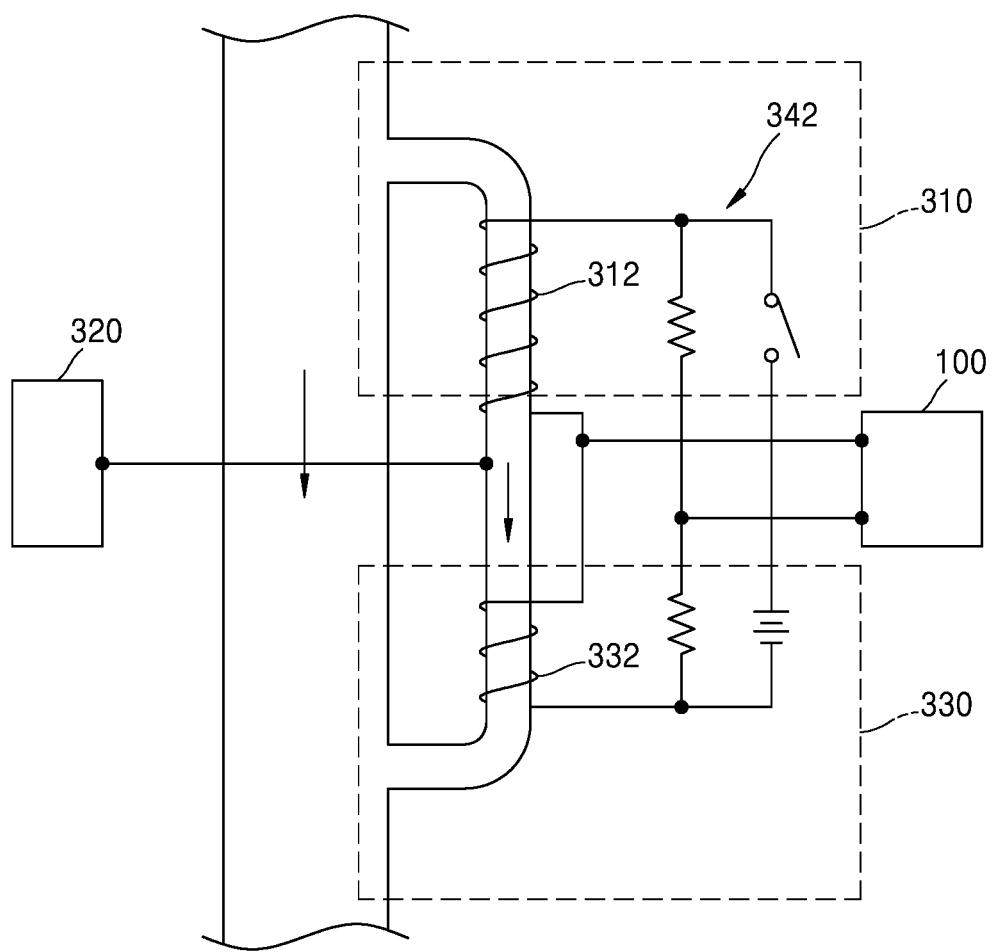
FIG. 6 is a schematic configuration diagram for explaining an example embodiment of a sensor shown in FIG. 4.

FIG. 6 is a schematic configuration diagram for explaining an example embodiment of the sensor shown in FIG. 4. Specifically, FIG. 6 is a configuration diagram for explaining the operation principle of the first sensor 310 and the second sensor 330 shown in FIG. 6.

The first sensor 310 may include a first resistor 312 and a portion of a bridge circuit 342. The second sensor 33 may include a second resistor 332 and another portion of the bridge circuit 342. Some of the fluid in the gas state flowing along the exhaust line may be input to the inlet of the U-shaped tube and discharged to the outlet of the U-shaped tube. The first resistor 312 may be wound around the inlet portion of the U-shaped tube, and the second resistor 332 may be wound around the outlet portion of the U-shaped tube. Both the first resistor 312 and the second resistor 332 may be connected to the bridge circuit 342. The first resistor 312 and the second resistor 332 may each include a coil for generating heat. The second heater 320 may be connected between the first resistor 312 and the second resistor 332 in the U-shaped tube. The second heater 320 may be configured to supply heat to the gaseous fluid that has passed through the region in which the first resistor 312 is wound in the U-shaped tube.

Heat generated from the first resistor 312 may be lost corresponding to the flow rate of the fluid flowing into the U-shaped tube. Heat generated from the second resistor 332 may be lost in response to the flow rate of the fluid supplied with heat from the second heater 320. The first resistor 312 and the second resistor 332 may each have a resistance value corresponding to the lost heat. The first resistor 312 and the second resistor 332 may be connected to the bridge circuit 342 to serve as one resistor, respectively. Accordingly, the first sensor 310 may measure the first temperature of the fluid based on the resistance value of the first resistor 312 corresponding to the lost heat. Also, the second sensor 330 may measure the second temperature of the fluid based on the resistance value of the second resistor 332 corresponding to the lost heat. The controller 100 may determine the flow rate of the fluid by comparing the first temperature measured by the first sensor 310 with the second temperature measured by the second sensor 330. For example, the flow rate of the fluid may be determined through heat conduction of the gaseous fluid, but the method is not limited thereto. The controller 100 may transmit a signal to stop the supply of the fluid to the valve 210 when the flow rate of the fluid is higher than a reference flow rate.

Figure 7:
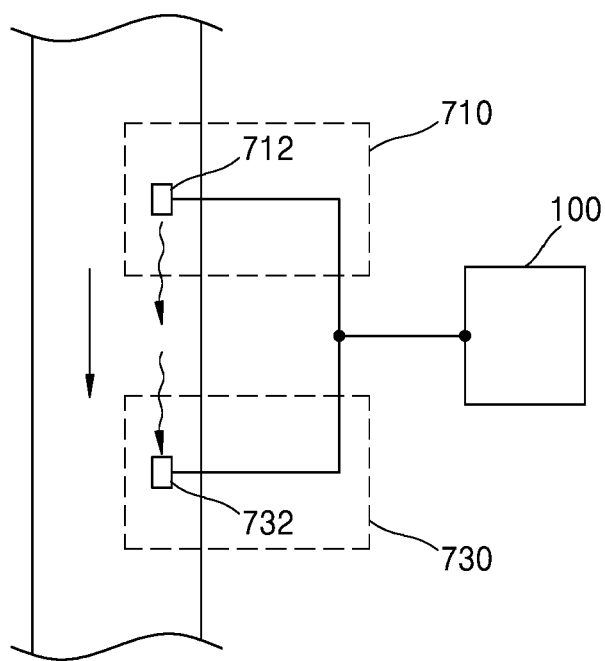
FIG. 7 is a schematic configuration diagram for explaining an example embodiment of the sensor shown in FIG. 4.

FIG. 7 is a schematic configuration diagram for explaining an example embodiment of the sensor shown in FIG. 4. The sensor 710 according to an example embodiment may determine the flow rate by using the fact that the propagation speed of ultrasonic waves is different when the fluid is stopped and when the fluid is flowing. The sensor 710 described in this embodiment may be otherwise referred to as an ultrasonic sensor. The sensor 710 may include a transmitter 712 and a receiver 732. The transmitter 712 may be disposed in a transmission area 710, and the receiver 732 may be disposed in a reception area 730. The transmitter 712 and the receiver 732 may be arranged side by side in the gas flow direction inside the exhaust line. Both the transmitter 712 and the receiver 732 may be connected to the controller 100. The transmitter 712 may emit ultrasonic waves while the fluid discharged from the chamber 510 flows through the exhaust line. Ultrasonic waves emitted from the transmitter 712 may be received by the receiver 732. The controller 100 may measure the time (hereinafter, referred to as flow time) that the ultrasonic wave emitted from the transmitter 712 is received by the receiver 732. In the controller 100, a flow time when gas does not flow in the exhaust line (hereinafter referred to as a reference time) and a flow rate of gas when gas normally flows in the exhaust line are preset. The controller 100 may calculate the flow rate of the gas currently flowing through the exhaust line by comparing the reference time to the measured flow time. Then, when the calculated flow rate and the preset flow rate exceed an error range, the controller 100 may transmit a signal to stop supplying the fluid to the valve.

At least one of the components, elements, modules or units (collectively "components" in this paragraph) represented by a block in the drawings may be embodied as various numbers of hardware, software and/or firmware structures that execute respective functions described above, according to an example embodiment. According to example embodiments, at least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Functional aspects of the above exemplary embodiments may be implemented in algorithms that execute on one or more processors. Furthermore, the components represented by a block or processing steps may employ any number of related art techniques for electronics configuration, signal processing and/or control, data processing and the like.

While example embodiments been particularly shown and described with reference to the drawings, it will be understood that various changes in form and details may be made therein without departing from the spirit and scope of the following claims and their equivalents.

What is claimed is:

1. A flow rate control method comprising:
supplying a fluid from a valve to a first sensor;
measuring, by the first sensor, a first temperature of the fluid, and heating the fluid;
measuring, by a second sensor, a second temperature of the heated fluid, and determining, by a controller, a first flow rate of the fluid based on comparison between the first temperature and the second temperature;
supplying the fluid to a chamber and supplying an ignition voltage to the chamber through a radio frequency (RF) power source;
measuring, by a third sensor, the ignition voltage;
comparing, by the controller, the ignition voltage and a reference voltage to determine a second flow rate of the fluid; and
controlling a supply of the fluid from the valve based on at least one of the first flow rate and or the second flow rate.

2. The method of claim 1, wherein the ignition voltage is a minimum voltage that is to be supplied to the chamber to ignite a plasma in the fluid.

3. The method of claim 1, wherein the determining the first flow rate of the fluid comprises determining the first flow rate of the fluid in a gaseous state.

4. The method of claim 1, wherein the comparing the ignition voltage and the reference voltage comprises determining the second flow rate of the fluid in a liquid state, a gaseous state, an aerosol state, or a combination thereof.

5. The method of claim 1, wherein the controlling the supply of the fluid comprising transmitting, by the controller, a feedback signal to the valve based on a result of the comparing the ignition voltage and the reference voltage.

6. The method of claim 5, wherein the transmitting the feedback signal comprises transmitting, by the controller to the valve, a signal to supply the fluid based on the ignition voltage being lower than the reference voltage.

7. The method of claim 5, wherein the transmitting the feedback signal comprises transmitting, by the controller to the valve, a signal to stop supplying the fluid based on the ignition voltage being higher than the reference voltage.

8. The method of claim 1, wherein the supplying the fluid comprises supplying the fluid at a flow rate of 3 Standard Cubic Centimeter per Minute (sccm) to 20 sccm.

9. The method of claim 1, wherein the supplying the fluid comprises supplying titanium tetrachloride ($TiCl_4$) from the valve to the first sensor.

10. The method of claim 1, wherein the reference voltage is 1 V to 100 V.

11. A flow rate control method comprising:
supplying a fluid from a valve to a first sensor;
measuring, by the first sensor, a first temperature of the fluid, and heating the fluid;
measuring, by a second sensor, a second temperature of the heated fluid, and determining, by a controller, a first flow rate of the fluid by comparing the first temperature and the second temperature;

supplying the fluid to a chamber and supplying an ignition voltage to the chamber through a radio frequency (RF) power source;

adjusting, by an RF matcher, an impedance in response to the ignition voltage;

measuring, by a third sensor, the adjusted impedance of the RF matcher;

comparing, by the controller, the adjusted impedance and a reference impedance to determine a second flow rate of the fluid; and controlling a supply of the fluid from the valve based on at least one of the first flow rate and or the second flow rate.

12. The method of claim 11, wherein the ignition voltage is a minimum voltage that is to be supplied to the chamber to ignite a plasma in the fluid.

13. The method of claim 11, wherein the controlling the supply of the fluid comprising transmitting, by the controller to the valve, a feedback signal based on a result of the comparing the impedance and the reference impedance.

14. The method of claim 13, wherein the transmitting the feedback signal comprises transmitting, by the controller to the valve, a signal to supply the fluid based on the impedance being less than the reference impedance.

15. The method of claim 13, wherein the transmitting the feedback signal comprises transmitting, by the controller to the valve, a signal to stop supplying the fluid based on the impedance being higher than the reference impedance.

16. The method of claim 11, wherein the determining the first flow rate of the fluid comprises determining the first flow rate of the fluid in a gaseous state.

17. The method of claim 11, wherein the comparing the adjusted impedance and the reference impedance comprises determining the second flow rate of the fluid in a liquid state, a gaseous state, an aerosol state, or a combination thereof.

18. The method of claim 11, wherein the supplying the fluid comprises supplying the fluid at a flow rate of 3 Standard Cubic Centimeter per Minute (sccm) to 20 sccm.

19. A flow rate control method comprising:

supplying a fluid from a valve to a first sensor;

measuring, by the first sensor, a first temperature of the fluid, and heating the fluid;

measuring, by a second sensor, a second temperature of the heated fluid, and determining, by a controller, a first flow rate of the fluid by comparing the first temperature and the second temperature;

supplying the fluid to a chamber and supplying an ignition voltage to the chamber through an RF power source;

measuring, by a third sensor, the ignition voltage;

comparing, by the controller, the ignition voltage and a reference voltage to determine a second flow rate of the fluid in a liquid state, a gaseous state, an aerosol state, or a combination thereof; and transmitting, by the controller, a feedback signal to the valve based on a result of the comparing the ignition voltage and the reference voltage, wherein the ignition voltage is a minimum voltage that is to be supplied to the chamber to ignite a plasma in the fluid, wherein the supplying the fluid comprises supplying the fluid at a flow rate of 3 Standard Cubic Centimeter per Minute (sccm) to 20 sccm, and the fluid comprises titanium tetrachloride ($TiCl_4$), and wherein the reference voltage is 1 V to 100 V.

20. The method of claim 19, wherein the transmitting the feedback signal comprises:

transmitting, to the valve, a signal to supply the fluid based on the ignition voltage being lower than the reference voltage; and transmitting, to the valve, a signal to stop supplying the fluid based on the ignition voltage being higher than the reference voltage.

* * * * *